United States Patent
Jung et al.

(10) Patent No.: US 9,769,886 B2
(45) Date of Patent: Sep. 19, 2017

(54) FLEXIBLE ORGANIC LIGHT-EMITTING DISPLAY APPARATUS AND METHOD OF MANUFACTURING THE SAME

(71) Applicant: Samsung Display Co., Ltd., Yongin (KR)

(72) Inventors: Woo-Suk Jung, Yongin (KR); Soon-Ryong Park, Yongin (KR); Hye-Jung Park, Yongin (KR); Seok-Gi Baek, Yongin (KR); Tae-Eun Kim, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 978 days.

(21) Appl. No.: 13/687,385

(22) Filed: Nov. 28, 2012

(65) Prior Publication Data

US 2014/0021856 A1 Jan. 23, 2014

(30) Foreign Application Priority Data

Jul. 19, 2012 (KR) ........................ 10-2012-0078958

(51) Int. Cl.
 *H05B 33/04* (2006.01)
 *H05B 33/10* (2006.01)
 *H01L 51/52* (2006.01)

(52) U.S. Cl.
 CPC ......... *H05B 33/04* (2013.01); *H01L 51/5253* (2013.01); *H01L 51/5256* (2013.01); *H05B 33/10* (2013.01)

(58) Field of Classification Search
 CPC ..... H05B 33/10; H05B 33/04; H01L 51/5253; H01L 51/5256
 See application file for complete search history.

(56) References Cited

U.S. PATENT DOCUMENTS

| | | | | |
|---|---|---|---|---|
| 7,816,676 | B2 * | 10/2010 | Fourst ................. | H01L 51/5237 257/100 |
| 2005/0088088 | A1 * | 4/2005 | Yamazaki ............. | H01L 51/003 313/512 |
| 2008/0006819 | A1 * | 1/2008 | McCormick ........ | H01L 51/5256 257/40 |
| 2010/0327737 | A1 * | 12/2010 | Hayashi ............... | B60Q 3/0253 313/504 |
| 2011/0171439 | A1 * | 7/2011 | Jahromi ................. | B32B 27/06 428/209 |
| 2013/0241076 | A1 * | 9/2013 | Mandlik ............. | H01L 51/5253 257/774 |

FOREIGN PATENT DOCUMENTS

| | | |
|---|---|---|
| KR | 10-2010-0032703 A | 3/2010 |
| KR | 10-2011-0045820 A | 5/2011 |

* cited by examiner

*Primary Examiner* — Anne Hines
(74) *Attorney, Agent, or Firm* — Knobbe, Martens, Olson & Bear, LLP

(57) ABSTRACT

In one aspect, a flexible organic light-emitting display apparatus including a substrate; a display device formed on a first surface of the substrate; a thin film encapsulation layer covering the display device; and a protection film generally surrounding the substrate, the display device, and the thin film encapsulation layer, and a method of manufacturing the flexible organic light-emitting display apparatus is provided.

11 Claims, 6 Drawing Sheets

FLEXIBLE ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2012-0078958, filed in the Korean Intellectual Property Office on Jul. 19, 2012, the disclosure of which is incorporated herein by reference in its entirety.

BACKGROUND

Field

The described technology generally relates to a flexible organic light-emitting display apparatus and a method of manufacturing the same.

Description of the Related Technology

An organic light-emitting display apparatus typically includes an organic light-emitting diode (OLED) including a hole injection electrode, an electron injection electrode, and an organic emission layer between the hole and electron injection electrodes, and is a self-emissive display apparatus in which light is emitted while excitons generated when holes injected by the hole injection electrode and electrons injected by the electron injection electrode are combined in the organic emission layer transit from an excited state to a ground state.

As self-emissive display apparatuses, organic light-emitting display apparatuses may be driven at a low voltage and may have a small weight and thickness since an additional light source is not required, and since they may have wide viewing angles, high contrast, and fast response speeds.

However, since an organic light-emitting display apparatus may deteriorate due to external moisture or oxygen, an OLED may be sealed to protect the OLED from external moisture or oxygen.

SUMMARY

The present embodiments provide a flexible organic light-emitting display apparatus, and a method of manufacturing the same.

Some embodiments provide a flexible organic light-emitting display apparatus including: a substrate; a display device formed on a first surface of the substrate; a thin film encapsulation layer covering the display device; and a protection film generally surrounding the substrate, the display device, and the thin film encapsulation layer.

In some embodiments, the protection film may include one or more components selected from the group consisting of a silicon (Si) material, an acryl-based resin material, and a urethane-based resin material.

In some embodiments, the silicon (Si) material may include one or more components selected from the group consisting of a silica-based material, a polysilazane-based material, and a siloxane-based material.

In some embodiments, a maximum thickness of the protection film may be 400 μm.

In some embodiments, the protection film generally may surround a first surface of the thin film encapsulation layer, side surfaces of the thin film encapsulation layer and the substrate, and a second surface of the substrate.

In some embodiments, the protection film may include a first protection film that covers a first surface of the thin film encapsulation layer and side surfaces of the thin film encapsulation layer and the substrate, and a second protection film that covers a second surface of the substrate.

In some embodiments, the second protection film may include a flexible film.

In some embodiments, the thin film encapsulation layer may include inorganic films and organic films that are alternately stacked.

In some embodiments, the flexible organic light-emitting display apparatus may further include an optical film disposed on a first surface of the protection film.

Some embodiments provide a flexible organic light-emitting display apparatus including: a flexible substrate; a pixel electrode disposed on a first surface of the flexible substrate; a counter electrode disposed on the pixel electrode; an organic emission layer disposed between the pixel electrode and the counter electrode and emitting light; a thin film encapsulation layer disposed on the counter electrode; and a protection film generally surrounding the flexible substrate, the pixel electrode, the counter electrode, the organic emission layer, and the thin film encapsulation layer.

In some embodiments, the protection film may include one or more components selected from the group consisting of a silica-based material, a polysilazane-based material, a siloxane-based material, an acryl-based resin material, and a urethane-based resin material.

In some embodiments, the protection film may generally surround a first surface of the thin film encapsulation layer, side surfaces of the thin film encapsulation layer and the flexible substrate, and a second surface of the flexible substrate.

In some embodiments, the protection film may include a first protection film that covers a first surface of the thin film encapsulation layer and side surfaces of the thin film encapsulation layer and the flexible substrate, and a second protection film that covers a second surface of the flexible substrate and includes a material different from the first protection film.

Some embodiments provide a method of manufacturing a flexible organic light-emitting display apparatus, the method including: forming a display device on a first surface of a substrate; forming a thin film encapsulation layer covering the display device; and forming a protection film that generally surrounds the substrate, the display device, and the thin film encapsulation layer.

In some embodiments, the forming of the protection film may include: forming a coating layer to generally surround the substrate, the display device, and the thin film encapsulation layer, wherein the coating layer includes a protection film forming curing material; and curing the coating layer at a temperature below 200° C. and forming the protection film.

In some embodiments, the protection film forming curing material may include one or more components selected from the group consisting of a silica-based material, a polysilazane-based material, a siloxane-based material, an acryl-based resin material, and a urethane-based resin material.

In some embodiments, the forming of the thin film encapsulation layer may include: forming inorganic films; and forming organic films.

In some embodiments, the forming of the protection film may include: forming a coating layer to generally surround a first surface and side surfaces of a stack structure of the substrate, the display device, and the thin film encapsulation layer, wherein the coating layer includes a protection film forming curing material; curing the coating layer at a temperature below 200° C. and forming a first protection film; and attaching a flexible film to cover a second surface of the stack structure and forming a second protection film.

In some embodiments, the method may further include: forming an optical film directly on the protection film.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Figure 1:
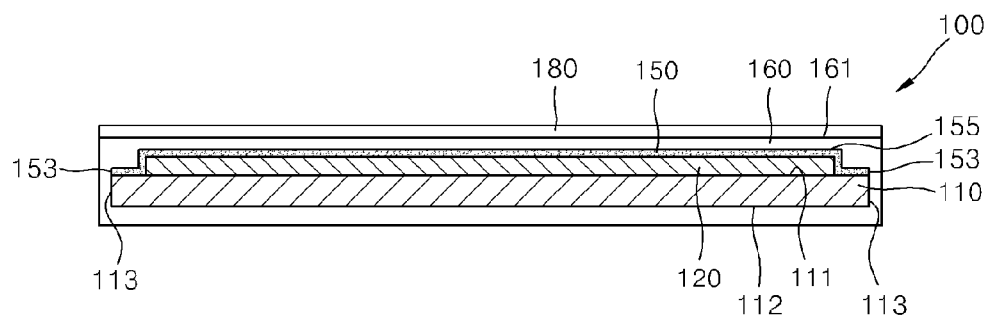
FIG. 1 is a schematic cross-sectional view of a flexible organic light-emitting display apparatus according to an aspect of the present embodiments.

Hereinafter, the present disclosure will be described in detail by explaining exemplary embodiments with reference to the attached drawings. The invention may, however, be embodied in many different forms and should not be construed as being limited to the embodiments set forth herein. Meanwhile, the terminology used herein is for the purpose of describing particular embodiments and is not intended to limit the invention. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, it will be understood that, although the terms 'first', 'second', etc. may be used herein to describe various elements, these elements should not be limited by these terms. These terms are only used to distinguish one element from another.

In the drawings, lengths and sizes of layers and regions may be exaggerated for clarity. It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list.

As used herein, the term "generally surrounds" or "generally surrounding" refers an item covering all exposed surfaces of the listed items. For example, embodiments that state a protection film generally surrounds a substrate, a display device, and a thin film encapsulation layer provides that the protection film covers all the exposed surfaces of the substrate, the display device, and the thin film encapsulation layer.

Figure 2:
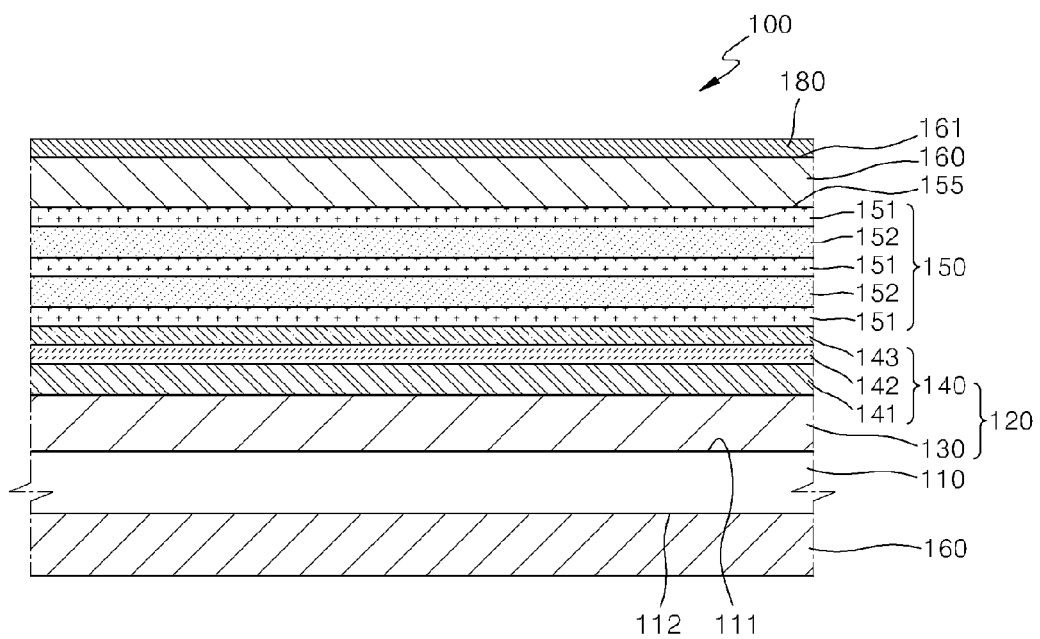
FIG. 2 is a detailed cross-sectional view of the flexible organic light-emitting display apparatus of FIG. 1.
Figure 3:
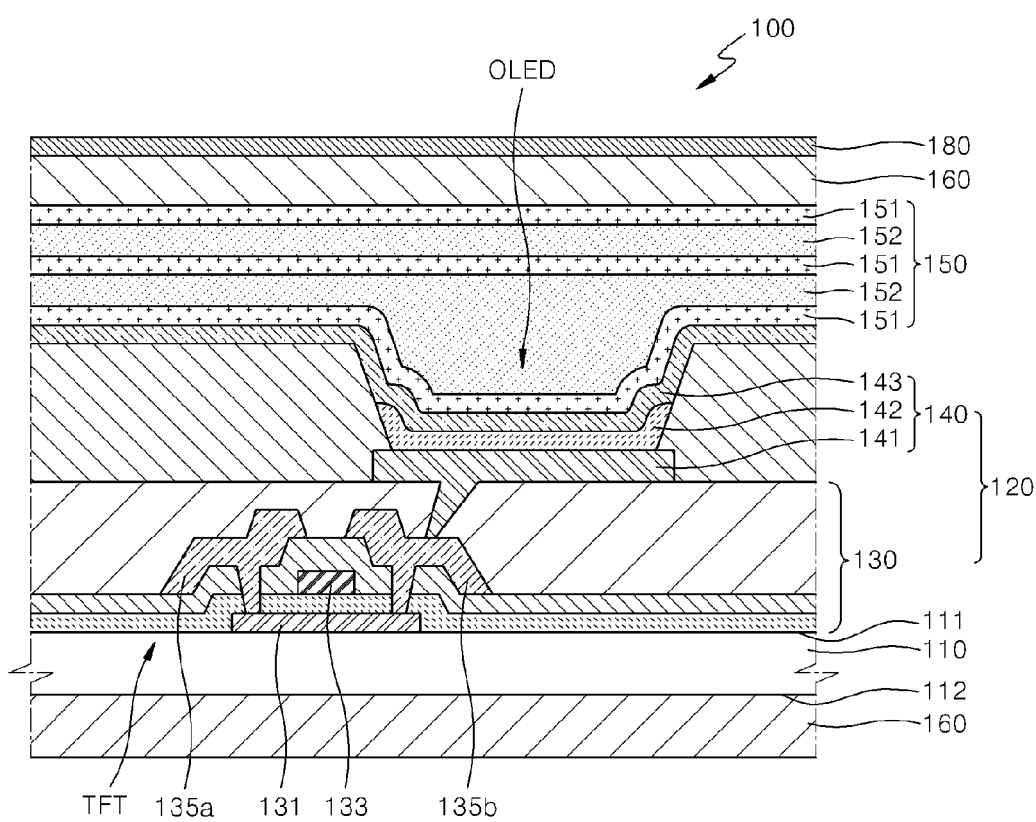
FIG. 3 is a schematic cross-sectional view of one pixel region of the flexible organic light-emitting display apparatus of FIG. 2.

FIG. 1 is a schematic cross-sectional view of a flexible organic light-emitting display apparatus 100 according to an embodiment. FIG. 2 is a detailed cross-sectional view of the flexible organic light-emitting display apparatus 100 of FIG. 1. FIG. 3 is a schematic cross-sectional view of one pixel region of the flexible organic light-emitting display apparatus 100 of FIG. 2.

Referring to FIGS. 1 and 2, the flexible organic light-emitting display apparatus 100 (hereinafter referred to as an "organic light-emitting display apparatus") according to an embodiment of the present invention may include a substrate 110, a display device 120 disposed on a first surface 111 of the substrate 110, a thin film encapsulation layer 150 disposed on the display device 120, and a protection film 160. The protection film 160 may be formed to generally surround the substrate 110, the display device 120, and the thin film encapsulation layer 150.

Referring to FIGS. 2 and 3, the display device 120 may include an organic light-emitting diode (OLED) 140 including a pixel electrode 141 disposed on the substrate 110, a counter electrode 143 disposed on the pixel electrode 141, and an organic emission layer 142 disposed between the pixel electrode 141 and the counter electrode 143. In some embodiments, the OLED 140 emits red, green, and blue light according to current and displays predetermined image information. In some embodiments, the OLED 140 may be disposed on a device/wiring layer 130.

In some embodiments, the substrate 110 may be a flexible substrate and may include polymer having excellent heat resistance and durability. For example, the substrate 110 may include any one selected from the group consisting of polyethersulfone (PES), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and a combination thereof.

In some embodiments, the device/wiring layer 130 may be disposed on the first surface 111 of the substrate 110 and may include a driving thin film transistor (TFT) for driving the OLED 140, a switching thin film transistor (not shown), a capacitor, and wirings (not shown) connected to the driving TFT and the capacitor. The driving TFT includes an active layer 131, a gate electrode 133, and source and drain electrodes 135a and 135b.

Although not shown, a barrier layer for preventing penetration of external impurities such as moisture or oxygen into the OLED 140 through the substrate 110 may be further disposed between the substrate 110 and the device/wiring layer 130.

The OLED 140 is disposed on the device/wiring layer 130. The OLED 140 includes the pixel electrode 141, the organic emission layer 142 disposed on the pixel electrode 141, and the counter electrode 143 formed on the organic emission layer 142.

In some embodiments, the pixel electrode 141 may be an anode and the counter electrode 143 may be a cathode. However, the present embodiments are not limited thereto and, according to a driving method of the organic light-emitting display apparatus 100, the pixel electrode 141 may be a cathode and the counter electrode 143 may be an anode. Holes and electrons are injected from the pixel electrode 141 and the counter electrode 143, respectively, into the organic emission layer 142. Light is emitted while excitons formed when the injected holes and electrons are combined transit from an excited state to a ground state.

The pixel electrode 141 is electrically connected to the driving TFT of the device/wiring layer 130.

Although the OLED 140 is disposed on the device/wiring layer 130 including the driving TFT in the present embodiment, the present invention is not limited thereto and various modifications may be made. For example, the pixel electrode 141 of the OLED 140 may be formed at the same level as the active layer 131, the gate electrode 133, or the source and drain electrodes 135a and 135b of the driving TFT.

Furthermore, although the gate electrode 133 of the driving TFT is depicted as disposed above the active layer 131 the present embodiments is not limited thereto and the gate electrode 133 may also be disposed under the active layer 131.

In some embodiments, the pixel electrode 141 of the OLED 140 may be a reflective electrode and may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or translucent electrode layer formed on the reflective film.

In some embodiments, the transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

In some embodiments, the counter electrode 143 disposed to face the pixel electrode 141 may be a transparent or translucent electrode, and may be formed as a metallic thin film including lithium (Li), calcium (Ca), lithium fluoride/calcium (LiF/Ca), lithium fluoride/aluminum (LiF/Al), aluminum (Al), silver (Ag), magnesium (Mg), or a compound thereof, and having a low work function. Also, an auxiliary electrode layer or a bus electrode may be further formed on the metallic thin film by using a material for forming a transparent electrode, e.g., ITO, IZO, ZnO, or $In_2O_3$.

Accordingly, the counter electrode 143 may transmit the light emitted from the organic emission layer 142.

Although the depicted embodiments describe a case where light emitted from the OLED 140 is emitted toward a top surface, i.e., the first surface 111 of the substrate 110 (a top emission type), the present embodiments are not limited thereto. In some embodiments, the light may be emitted toward a second surface 112 of the substrate 110 (a bottom emission type), and the light may be emitted toward the first and second surfaces 111 and 112 of the substrate 110 (a dual emission type). In the case where the organic light-emitting display apparatus 100 according to an embodiment of the present invention is a bottom emission type display apparatus, the pixel electrode 141 may be formed as a semi-transmission film, and the counter electrode 143 may be formed as a reflective film. In some embodiments, where the organic light-emitting display apparatus 100 is a dual emission type display apparatus, the pixel electrode 141 and the counter electrode 143 may be formed as transparent or translucent films.

In some embodiments, the organic emission layer 142 may be disposed between the pixel electrode 141 and the counter electrode 143, and may be formed of a low-molecular or high-molecular organic material.

In addition to the organic emission layer 142, intermediate layers such as a hole transport layer (HTL), a hole injection layer (HIL), an electron transport layer (ETL), and an electron injection layer (EIL) may be selectively disposed between the pixel electrode 141 and the counter electrode 143.

In some embodiments, the thin film encapsulation layer 150 may seal and protect the OLED 140 from the outside. In some embodiments, the thin film encapsulation layer 150 may include a thin film including one or more inorganic films 151 and one or more organic films 152. In some embodiments, the substrate 110 may be the flexible substrate, and the thin film encapsulation layer 150 may be formed as the thin film including the inorganic films 151 and the organic films 152, thereby easily implementing flexibility and thinning of the organic light-emitting display apparatus 100.

In some embodiments, the inorganic films 151 may be disposed closest to the OLED 140 and include a metal oxide, a metal nitride, a metal carbide, or a compound thereof. For example, the inorganic films 151 may include at least one inorganic material from $Al_2O_3$, $TiO_2$, ZrO, $SiO_2$, AlON, AlN, SiON, $Si_3N_4$, ZnO, and $Ta_2O_5$.

In some embodiments, the organic films 152 may include polymer based materials. In some embodiments, the polymer based materials may include acryl based resin, epoxy based resin, polyimide, polyethylene, etc. In some embodiments, the organic films 152 may reduce internal stress of, complement defects of, and planarize the inorganic films 510.

Although the depicted embodiments exemplify a case where the inorganic films 151 are stacked three times, and the organic films 152 are stacked two times, the present embodiments are not limited thereto. That is, the number of inorganic films 151 and organic films 152 that are alternately stacked is not limited by the depicted embodiments.

In some embodiments, the protection film 160 may be formed to generally surround the substrate 110, the display device 120, and the thin film encapsulation layer 150 while covering a first surface 155 of the thin film encapsulation layer 150, side surfaces 113 and 153 of the thin film encapsulation layer 150 and the substrate 110, and the second surface 112 of the substrate 110. In some embodiments, the protection film 160 may be formed to generally surround the substrate 110, the display device 120, and the thin film encapsulation layer 150, thereby preventing a thin film encapsulation from being separated from the organic light-emitting display apparatus 100 during a process of manufacturing the organic light-emitting display apparatus 100.

A comparative example of the present embodiments, where the protection film 160 is not formed in the organic light-emitting display apparatus 100, after the thin film encapsulation layer 150 is formed, a film may be temporarily attached so as to prevent the thin film encapsulation layer 150 from being damaged during a process of attaching an optical film 180 on the thin film encapsulation layer 150. The temporarily attached film is removed before the optical film 180 is attached to the thin film encapsulation layer 150. In this regard, an adhesive force of the temporarily attached film may cause a peel-off phenomenon in that the thin film encapsulation layer 150 that is thin peels off from the substrate 110 and/or the display device 120 or a fine crack therebetween. In the case where the thin film encapsulation layer 150 peels off from the substrate 110 and/or the display device 120 or the fine crack therebetween, moisture or oxygen may penetrate into the organic emission layer 142. Also, an electrostatic force that occurs when the temporarily attached film is removed may deteriorate or damage a characteristic of the display device 120.

In contrast, according to the present embodiments, the protection film 160 may be formed to generally surround the substrate 110, the display device 120, and the thin film encapsulation layer 150, and thus no film is temporarily attached in order to protect the thin film encapsulation layer 150 during the process of manufacturing the organic light-emitting display apparatus 100.

In addition, the protection film 160 may be formed to generally surround the substrate 110, the display device 120, and the thin film encapsulation layer 150, and thus a path via which oxygen or moisture may penetrate may be totally blocked.

In some embodiments, the protection film 160 may be formed using a coating and curing method. In some embodiments, the protection film 160 may include one of a silicon (Si) material, an acryl-based resin material, and a urethane-based resin material. In some embodiments, the silicon (Si) material may include a silica-based material, a polysilazane-based material, and a siloxane-based material.

In some embodiments, the thickness of the protection film 160 may be formed to the extent that the flexibility of the organic light-emitting display apparatus 100 is not damaged. For example, the thickness of the protection film 160 may be less than about 400 μm such that flexibility of the organic light-emitting display apparatus 100 may be secured.

In some embodiments, the optical film 180 may be further formed on a first surface 161 of the protection film 160. In some embodiments, the optical film 180 may use a phase delay plate and/or a polarization plate. In some embodiments, the optical film 180 may inhibit reflection of external light to enhance visibility and contrast of the organic light-emitting display apparatus 100.

A method of manufacturing the organic light-emitting display apparatus 100 will now be described.

FIGS. 4 through 7 are sequential cross-sectional views for describing a method of manufacturing the organic light-emitting display apparatus 100 of FIG. 1, according to an embodiment.

Figure 4:
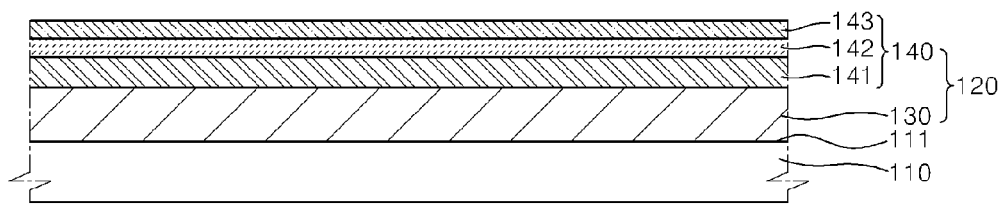
FIGS. 4 through 7 are sequential cross-sectional views for describing a method of manufacturing the flexible organic light-emitting display apparatus of FIG. 1, according to an aspect of the present embodiments.

Referring to FIG. 4, the display device 120, including the device/wiring layer 130 and the OLED 400, including the pixel electrode 141, the organic emission layer 142, and the counter electrode 143, are formed on the first surface 111 of the substrate 110.

In some embodiments, the substrate 110 may be a flexible substrate and may be a plastic substrate including polymer having excellent heat resistance and durability as described above. In some embodiments, the flexible substrate may be disposed on a support substrate (not shown) formed of glass for supporting the flexible substrate. In some embodiments, the support substrate (not shown) may be removed after a process completely ends or during the process.

In some embodiments, a barrier layer (not shown) may be further formed on the first surface 111 of the substrate 110. In some embodiments, the barrier layer (not shown) may include the inorganic films 151 and/or the organic films 152, and prevents penetration of external impurities into the device/wiring layer 130 and the OLED 140 through the substrate 110.

In some embodiments, the device/wiring layer 130 may include the driving TFT (see FIG. 3) for driving the OLED 140, a capacitor (not shown), and wiring (not shown).

In some embodiments, the pixel electrode 141, the organic emission layer 142, and the counter electrode 143 are sequentially formed on the device/wiring layer 130.

In some embodiments, the pixel electrode 141 may be a reflective electrode, and the counter electrode 143 may be a transparent or translucent electrode. Accordingly, light generated by the organic emission layer 142 may be emitted toward the counter electrode 143 directly or after being reflected on the pixel electrode 141. In this regard, the counter electrode 143 may be formed as a translucent electrode and thus the pixel electrode 141 and the counter electrode 143 may form a resonance structure.

In some embodiments, the organic light-emitting display apparatus 100 may be formed having a top emission type structure as described above. According to another embodiment, the organic light-emitting display apparatus 100 may be formed as a bottom emission type or a dual emission type structure. In this case, the pixel electrode 141 and the counter electrode 143 are the same as described above.

In some embodiments, the organic emission layer 142 may be formed of a low-molecular or high-molecular organic material. In addition to the organic emission layer 142, the intermediate layers as stated above may be selectively formed between the pixel electrode 141 and the counter electrode 143. Although the OLED 140 is formed on the device/wiring layer 130 in the depicted embodiment, the present embodiments are not limited thereto and the device/wiring layer 130 and the OLED 140 may be formed at the same level.

Figure 5:
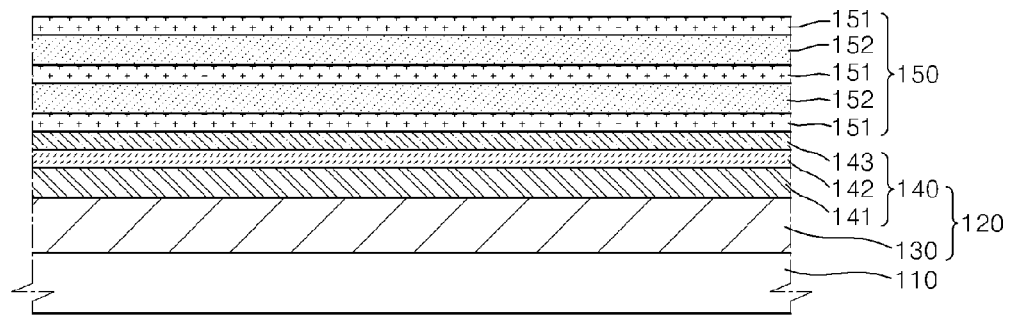

Referring to FIG. 5, the thin film encapsulation layer 150 is formed. In some embodiments, the thin film encapsulation layer 150 may be formed by alternately forming the inorganic films 151 and the organic films 152. In some embodiments, the inorganic films 151 may be formed as the lowermost and uppermost layers of the thin film encapsulation layer 150 contacting the counter electrode 143. In some embodiments, the number of inorganic films 151 and organic films 152 that are alternately formed is not limited to the number shown in FIG. 5.

Figure 6:
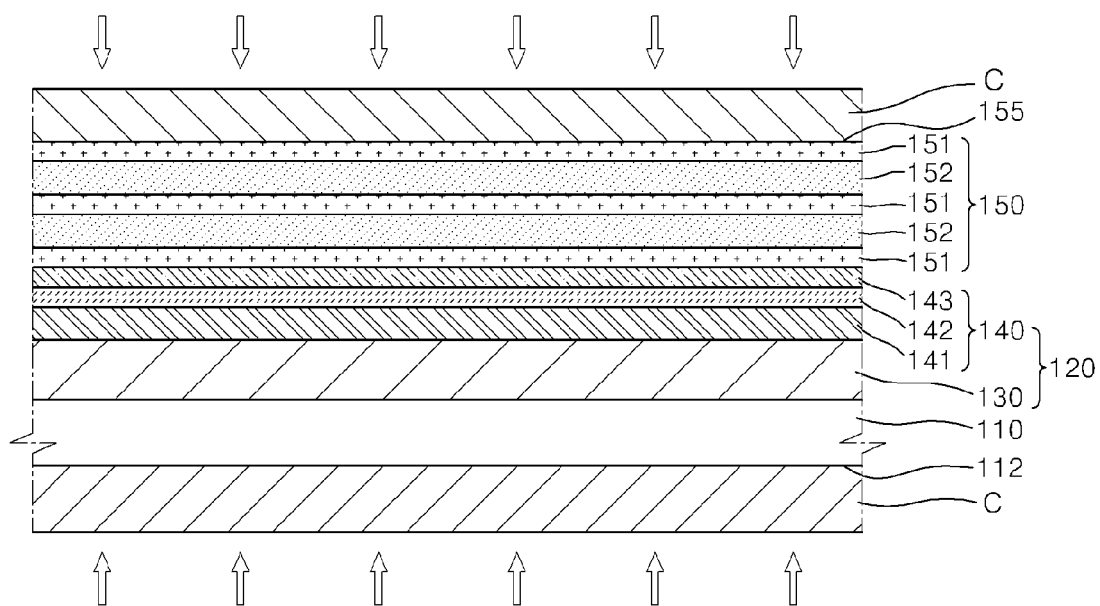

Thereafter, referring to FIG. 6, a protection film forming curing material C is applied to generally surround the substrate 110, the display device 120, and the thin film encapsulation layer 150. More specifically, the protection film forming curing material C may be coated to cover the first surface 155 of the thin film encapsulation layer 150, the side surfaces 113 and 153 of the thin film encapsulation layer 150 and the substrate 110, and the second surface 112 of the substrate 110. In this regard, the protection film forming curing material C may be coated having a thickness of less than about 400 μm. In some embodiments, the protection film forming curing material C may be coated having a thickness of less than 400 μm. In some embodiments, the protection film forming curing material C may be coated having a thickness in a range of from 100 μm to 400 μm.

In some embodiments, the protection film forming curing material C may include one of a silicon (Si) material, an acryl-based resin material, and a urethane-based resin material. In some embodiments, the silicon (Si) material may include a silica-based material, a polysilazane-based material, and a siloxane-based material. In some embodiments, the protection film forming curing material C may be coated using a spray coating method, a spin coating method, a slit coating method, etc. In some embodiments, a roller coating method may be used to coat the protection film forming curing material C.

Figure 7:
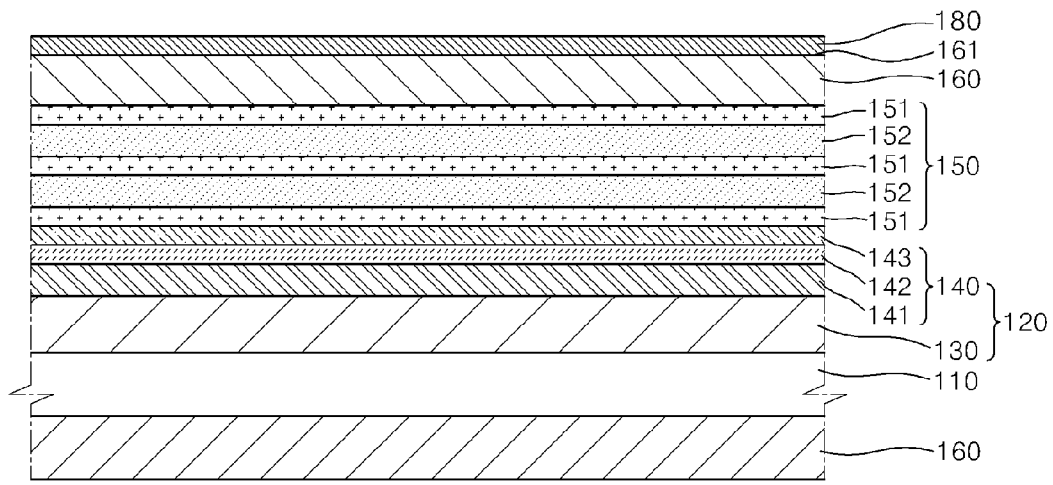

Referring to FIG. 7, the protection film 160 may be formed by curing the protection film forming curing material C by using thermal energy or light energy such as UV light. A curing temperature may be below about 200° C. In some embodiments, a curing temperature may be below 200° C. In some embodiments, a curing temperature may be in a range of from 100° C. to 200° C. If the curing temperature exceeds 200° C., an organic light-emitting material of the organic emission layer 142 may deteriorate due to a high temperature.

In some embodiments, the protection film forming curing material C may further include an additive so that the protection film forming curing material C may be cured at the temperature below about 200° C. The additive may include palladium, an amine-based material, etc. but is not limited thereto.

In some embodiments, the optical film 180 may be further attached to the first surface 161 of the protection film 160. A process of removing impurities that are likely to be present in the first surface 161 of the protection film 160 may be further performed before the optical film 180 is attached. In some embodiments, the optical film 180 may use a phase delay plate or a polarization plate.

In the case of the organic light-emitting display apparatus according to the comparison example as described above, a film is temporarily attached so as to prevent the thin film encapsulation layer 150 from being damaged during a process of attaching the optical film 180 onto the thin film encapsulation layer 150, whereas, according to the present embodiments, the protection film 160 may be formed to generally surround the substrate 110, the display device 120, and the thin film encapsulation layer 150, and thus no film is temporarily attached in order to protect the thin film encapsulation layer 150 during the process of manufacturing the organic light-emitting display apparatus 100 as described above. In addition, the protection film 160 may be formed to generally surround the substrate 110, the display device 120, and the thin film encapsulation layer 150, and thus a path via which oxygen or moisture may penetrate may be totally blocked.

Figure 8:
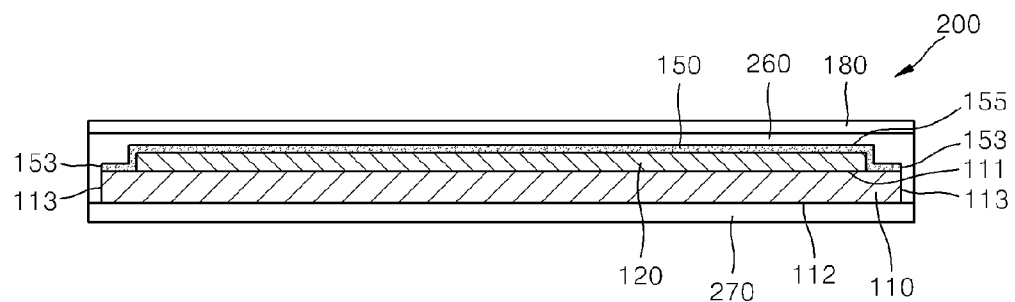
FIG. 8 is a schematic cross-sectional view of a flexible organic light-emitting display apparatus according to an aspect of the present embodiments.
Figure 9:
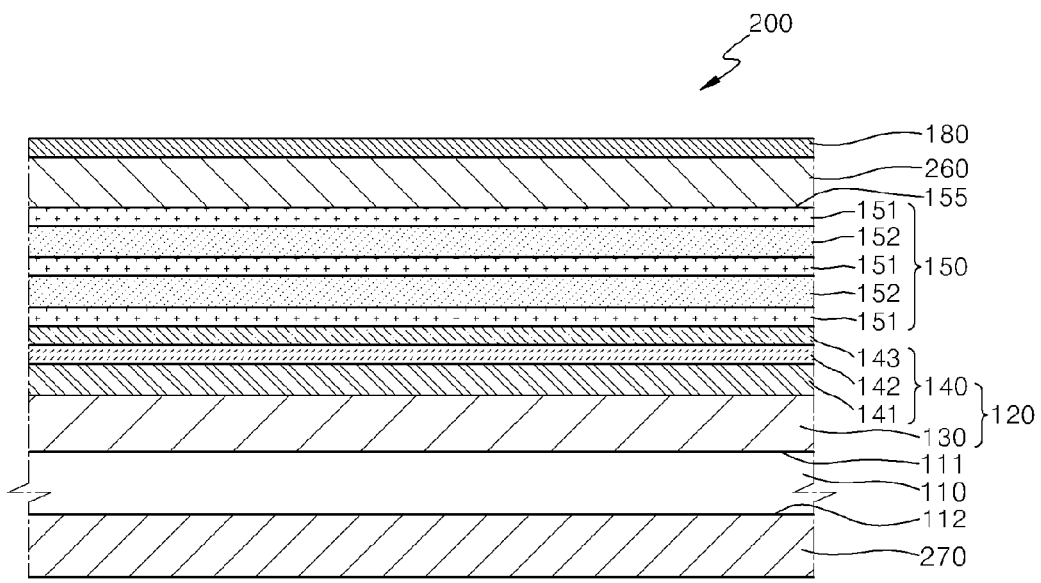
FIG. 9 is a detailed cross-sectional view of the flexible organic light-emitting display apparatus of FIG. 8.

FIG. 8 is a schematic cross-sectional view of a flexible organic light-emitting display apparatus 200 according to another depicted embodiment of the present embodiments. FIG. 9 is a detailed cross-sectional view of the flexible organic light-emitting display apparatus 200 of FIG. 8.

Referring to FIGS. 8 and 9, the flexible organic light-emitting display apparatus 200 may include the substrate 110, the display device 120 disposed on the first surface 111 of the substrate 110, the thin film encapsulation layer 150 disposed on the display device 120, and protection films 260 and 270. In some embodiments, the protection films 260 and 270 may be formed to generally surround the substrate 110, the display device 120, and the thin film encapsulation layer 150. In some embodiments, the optical film 180 may be further disposed on the protection films 260 and 270, for example, directly on the protection films 260 and 270.

In some embodiments, the display device 120 may include the OLED 140 including the pixel electrode 141 disposed on the substrate 110, the counter electrode 143 disposed on the pixel electrode 141, and the organic emission layer 142 disposed between the pixel electrode 141 and the counter electrode 143. In some embodiments, the OLED 140 emits red, green, and blue light according to current and displays predetermined image information, and may be disposed on the device/wiring layer 130, which is the same as described with reference to FIGS. 1 through 7.

However, the organic light-emitting display apparatus 100 and the flexible organic light-emitting display apparatus 200 differ from each other in that the protection film 160 described with reference to FIGS. 1 through 7 has a structure in which one material surrounds the substrate 110, the display device 120, and the thin film encapsulation layer 150, whereas the protection films 260 and 270 according to the embodiment depicted in FIGS. 8 and 9 may include two different materials.

Differences between the organic light-emitting display apparatus 100 and the flexible organic light-emitting display apparatus 200 will now be described.

The protection films 260 and 270 may surround the substrate 110, the display device 120, and the thin film encapsulation layer 150 and include the first protection film 260 formed to cover the first surface 155 of the thin film encapsulation layer 150 and the side surfaces 113 and 153 of the thin film encapsulation layer 150 and the substrate 110, and the second protection film 270 formed to cover the second surface 112 of the substrate 110.

The first protection film 260 may be formed of the same material as the protection film 160 described with reference to FIG. 1. For example, the first protection film 260 may include one or more components selected from the group consisting of a silicon (Si) material such as a silica-based material, a polysilazane-based material, or a siloxane-based material, an acryl-based resin material, and a urethane-based resin material.

As described above, the first protection film 260 may be formed by applying the protection film forming curing material C using a spray coating method and curing the protection film forming curing material C at a temperature below about 200° C. by using thermal energy or light energy such as UV light. In some embodiments, a curing temperature may be below 200° C. In some embodiments, a curing temperature may be in a range of from 100° C. to 200° C. In some embodiments, the protection film forming curing material C for forming the first protection film 260 may be applied on the first surface 155 of the thin film encapsulation layer 150 and the side surfaces 113 and 153 of the thin film encapsulation layer 150 and the substrate 110, respectively.

In some embodiments, the second protection film 270 may include a flexible film. In some embodiments, the flexible film may be attached onto the second surface 112 of the substrate 110 that is externally exposed after the first protection film 260 is formed by curing the protection film forming curing material C.

With respect to the protection films 260 and 270, the flexible organic light-emitting display apparatus 200 may include, in some embodiments, the first protection film 260, a temporary film is not used when the optical film 180 is attached, thereby preventing the thin film encapsulation layer 150 from being peeled off or a fine crack from occurring between the thin film encapsulation layer 150 and the substrate 110, and preventing a device from deteriorating or being damaged due to static electricity.

In some embodiments, an organic light-emitting material may be protected from oxygen or moisture, a manufacturing process may be simplified, and an additional film may not be temporarily attached during the manufacturing process, thereby preventing a device from deteriorating or being damaged due to the temporarily attached film.

While the present embodiments have been particularly shown and described with reference to exemplary embodiments thereof, it will be understood by those of ordinary skill in the art that various changes in form and details may be made therein without departing from the spirit and scope of the embodiments defined by the following claims.

What is claimed is:

1. A flexible organic light-emitting display apparatus comprising:
   a substrate including a first surface and a second surface opposite the first surface;

a display device on the first surface of the substrate and comprising a plurality of organic light-emitting diodes (OLEDs);

a thin film encapsulation layer including at least an organic film and at least an inorganic film and covering the display device, an end portion of the thin film encapsulation layer extends beyond an end of the display device and partially covers an area of the first surface of the substrate on which the display device is not disposed;

a first protection film arranged to directly contact the thin film encapsulation layer and generally covering each exposed surface of the substrate and the thin film encapsulation layer; and a second protection film on the second surface of the substrate.

2. The flexible organic light-emitting display apparatus of claim 1, wherein the first protection film comprises one or more components selected from the group consisting of a silicon (Si) material, an acryl-based resin material, and a urethane-based resin material.

3. The flexible organic light-emitting display apparatus of claim 2, wherein the first protection film comprises one or more components consisting of a silicon (Si) material, the silicon (Si) material comprises a silica-based material, a polysilazane-based material, and a siloxane-based material.

4. The flexible organic light-emitting display apparatus of claim 1, wherein a maximum thickness of the first protection film is 400 μm.

5. The flexible organic light-emitting display apparatus of claim 1, wherein the first protection film covers a first surface of the thin film encapsulation layer and side surfaces of the thin film encapsulation layer and the substrate, and the second protection film covers the second surface of the substrate.

6. The flexible organic light-emitting display apparatus of claim 5, wherein each of the first and second protection films comprises a flexible film.

7. The flexible organic light-emitting display apparatus of claim 1, wherein the thin film encapsulation layer comprises inorganic films and organic films that are alternately stacked.

8. The flexible organic light-emitting display apparatus of claim 1, further comprising an optical film disposed on a first surface of the first protection film.

9. A flexible organic light-emitting display apparatus comprising:

a flexible substrate including a first surface and a second surface opposite the first surface;

a pixel electrode disposed on the first surface of the flexible substrate;

a counter electrode disposed on the pixel electrode;

an organic emission layer disposed between the pixel electrode and the counter electrode and emitting light;

a thin film encapsulation layer disposed on the counter electrode and including at least an organic film and at least an inorganic film, an end portion of the thin film encapsulation layer extends beyond an end of the counter electrode and partially covers an area of the substrate on which the counter electrode is not disposed;

a first protection film arranged to directly contact the thin film encapsulation layer and generally covering each exposed surface of the flexible substrate-and the thin film encapsulation layer; and a second protection film on the second surface of the substrate.

10. The flexible organic light-emitting display apparatus of claim 9, wherein the first protection film comprises one or more components selected from the group consisting of a silica-based material, a polysilazane-based material, a siloxane-based material, an acryl-based resin material, and a urethane-based resin material.

11. The flexible organic light-emitting display apparatus of claim 9, wherein the first protection film covers a first surface of the thin film encapsulation layer and side surfaces of the thin film encapsulation layer and the flexible substrate, and the second protection film covers the second surface of the flexible substrate and comprises a material different from the first protection film.

* * * * *